United States Patent
Kim et al.

(10) Patent No.: US 10,978,528 B2
(45) Date of Patent: Apr. 13, 2021

(54) ORGANIC LIGHT EMITTING DISPLAY DEVICE

(71) Applicant: LG Display Co., Ltd., Seoul (KR)

(72) Inventors: Soojin Kim, Paju-si (KR); Daeil Kang, Paju-si (KR); Dojoong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/721,682

(22) Filed: Dec. 19, 2019

(65) Prior Publication Data
US 2020/0212145 A1 Jul. 2, 2020

(30) Foreign Application Priority Data
Dec. 26, 2018 (KR) .................. 10-2018-0169685

(51) Int. Cl.
*H01L 27/32* (2006.01)
(52) U.S. Cl.
CPC ...... *H01L 27/3246* (2013.01); *H01L 27/3211* (2013.01); *H01L 27/3276* (2013.01)

(58) Field of Classification Search
CPC ............ H01L 27/3246; H01L 27/3211; H01L 27/3276
USPC ........................................... 257/40
See application file for complete search history.

(56) References Cited

U.S. PATENT DOCUMENTS 10,496,204 B2 * 12/2019 Heo ............... G06F 3/0412

\* cited by examiner

*Primary Examiner* — Tu-Tu V Ho
(74) *Attorney, Agent, or Firm* — Polsinelli PC

(57) ABSTRACT

An organic light-emitting display comprises a substrate having a first area and second and third areas neighboring the first area in a column direction and defined in edge parts of both sides in the first area; a plurality of subpixels arranged on the substrate in the column direction and a row direction crossing the column direction; a plurality of first electrodes allocated to each of the plurality of subpixels; and a bank positioned on the first electrodes, wherein the bank comprises a first bank having a first opening exposing the plurality of first electrodes arranged in the row direction; and a second bank having a second opening exposing the plurality of first electrodes arranged in the column direction in the first area and a third opening exposing the one first electrode in at least one of the second area and the third area.

20 Claims, 20 Drawing Sheets

ORGANIC LIGHT EMITTING DISPLAY DEVICE

CROSS REFERENCE TO RELATED APPLICATION

This application claims priority from Korean Patent Application No. 10-2018-0169685 filed on Dec. 26, 2018, which is hereby incorporated by reference in its entirety.

BACKGROUND

Field of the Disclosure

The present disclosure relates to a display devise, and more particularly, to an organic light-emitting display. Although the present disclosure is suitable for a wide scope of applications, it is particularly suitable for securing thickness uniformity of an organic emission layer formed by a solution process in manufacturing the organic light-emitting display.

Description of the Background

Various display devices capable of reducing weight and volume, which is disadvantages of the cathode ray tube, are developed. Such display devices may be implemented as a liquid crystal display (LCD), a plasma display panel (PDP), a field emission display (FED), an organic light-emitting diode (OLED) display, etc.

An organic light-emitting display is a self-emission device emitting light without an additional light source, and has advantages of fast response time and high emission efficiency, high brightness and wide viewing angle. Furthermore, the organic light-emitting display may be implemented as a flexible display device because elements can be formed on a flexible substrate, such as plastic.

As large-area and high-resolution organic light-emitting displays are recently required, multiple subpixels are included in a single panel. In general, a mask is used for red (R), green (G), and blue (B) subpixel patterning. Accordingly, in order to implement a large-area display device, a corresponding large-area fine metal mask (FMM) is necessary. However, as the display device has a larger area, various failures including an organic light-emitting material configuring is not deposited in place, occur because a phenomenon in which the mask droops occurs.

In order to solve problems of the above-described deposition method using the mask, a solution process that is simple and advantageous for a large area attracts attention. The solution process enables large area patterning without a mask through inkjet printing or nozzle printing, and has a very high material use ratio of about 50 to 80% compared to the vacuum deposition having a material use ratio of 10% or less. Furthermore, the solution process has excellent thermal stability and morphology characteristics because it has a higher glass transition temperature compared to a thin vacuum deposition film.

However, when an emission layer is formed by a solution process, there is a problem in that the lifespan of a device is reduced or a dark point occurs because a thickness deviation occurs in an organic emission layer within a subpixel.

SUMMARY

Accordingly, the present disclosure is directed to an organic light-emitting display that substantially obviates one or more of problems due to limitations and disadvantages of the prior art.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

More specifically, the present disclosure provides an organic light-emitting display having reduced display quality degradation attributable to a thickness deviation within a subpixel by securing the thickness uniformity of an organic emission layer.

To achieve these and other advantages and in accordance with the purpose of the present invention, as embodied and broadly described, an organic light-emitting display comprises a substrate having a first area and second and third areas neighboring the first area in a column direction and defined in edge parts of both sides in the first area; a plurality of subpixels arranged on the substrate in the column direction and a row direction crossing the column direction; a plurality of first electrodes allocated to each of the plurality of subpixels; and a bank positioned on the first electrodes, wherein the bank comprises a first bank having a first opening exposing the plurality of first electrodes arranged in the row direction; and a second bank having a second opening exposing the plurality of first electrodes arranged in the column direction in the first area and a third opening exposing the one first electrode in at least one of the second area and the third area.

In another aspect of the present disclosure, an organic light-emitting display comprises a substrate where first, second and third areas are defined, and the first area being adjacent to both of the second and third areas in a row direction; a plurality of subpixels arranged on the substrate in the row direction; a plurality of first electrodes disposed in each of the plurality of subpixels; a first bank disposed between two adjacent first electrodes in the column direction and having a first opening exposing the plurality of first electrodes arranged in a column direction that crosses the row direction; and a second bank disposed between two adjacent first electrode the row direction and having a second opening exposing the plurality of first electrodes arranged in the column direction in the first area and a third opening exposing the one first electrode in at least one of the second area and the third area.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principles of the disclosure.

In the drawings.

DETAILED DESCRIPTION

Figure 1:
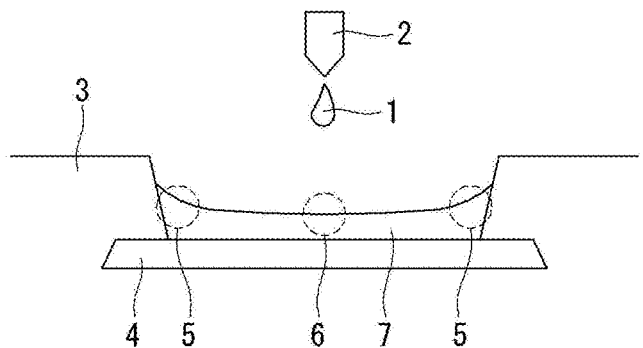
FIG. 1 is a schematic diagram for illustrating a problem in a solution process.

Hereinafter, aspects of the present disclosure are described with reference to the accompanying drawings. Throughout the specification, the same reference numeral substantially denotes the same element. In the following description, a detailed description of known technology or element related to the present disclosure will be omitted if it is deemed to make the gist of the present disclosure unnecessarily vague. In describing several aspects, the same element is representatively described at the introductory part of this specification, and may be omitted in other aspects.

Terms including ordinal numbers such as the first and the second may be used to describe various elements, but the elements are not limited by the terms. The terms are used to only distinguish one element from the other element.

FIG. 1 is a diagram for illustrating a problem of a solution process.

Referring to FIG. 1, when an organic emission layer is formed by using a solution process (or soluble process), there is a problem in that the emission characteristic of an organic light-emitting display can be degraded because a pile-up phenomenon during the solution process. More specifically, an organic light-emitting material 1 is dropped through an inkjet device 2 on a first electrode 4 and partitioned by a bank 3. The dropped organic light-emitting material 1 has a thickness deviation according to its position due to a curing speed difference in the curing process. That is, an edge part 5 adjoining the bank 3 is thick, and a thin and irregular organic emission layer 7 is formed in a central part 6.

When the organic emission layer 7 is irregularly formed as described above, there may be a problem in that display quality is degraded because a brightness deviation according to the position occurs. Furthermore, there may be a problem in that the lifespan of a device can be reduced because a current density difference occurs within the organic emission layer 7 or the process yield is reduced because a dark point occurs. Accordingly, it is necessary to minimize the area in which a pile-up phenomenon occurs in forming an emission layer using a solution process when such a problem is taken into consideration.

Figure 2:
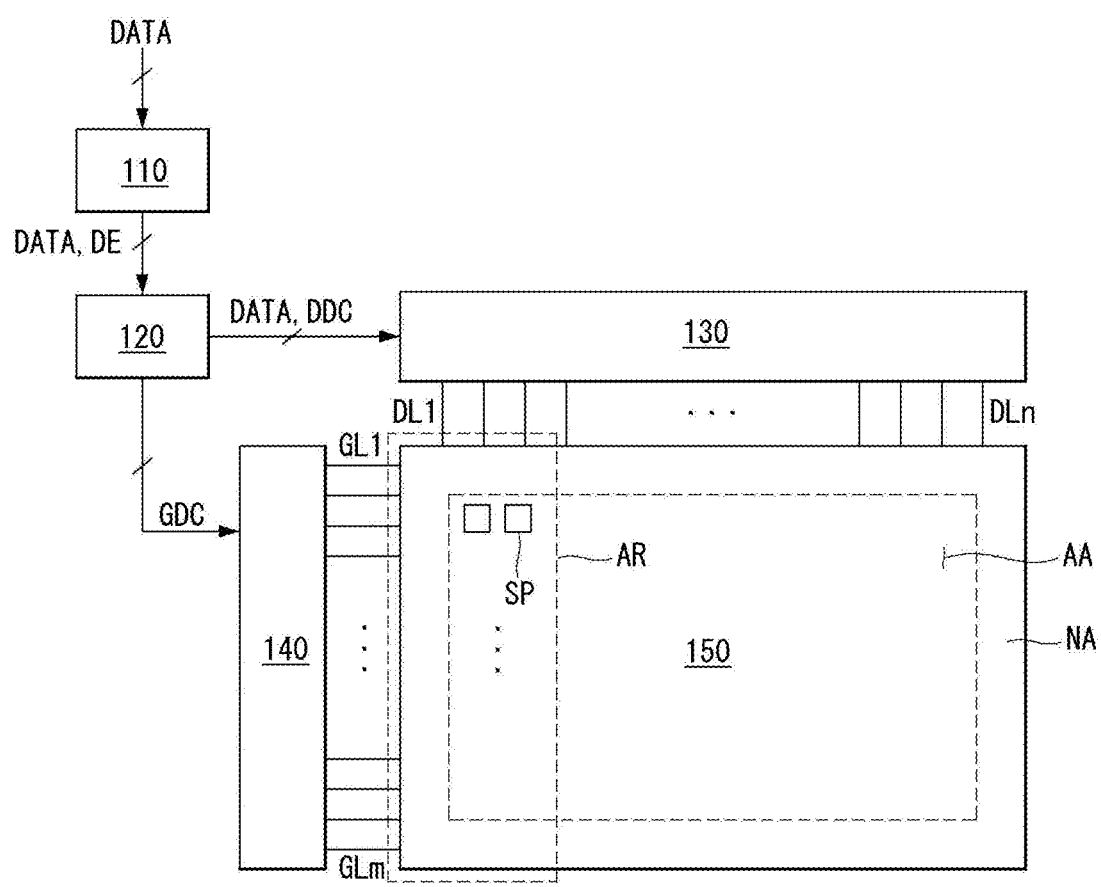
FIG. 2 is a schematic block diagram of an organic light-emitting display.
Figure 3:
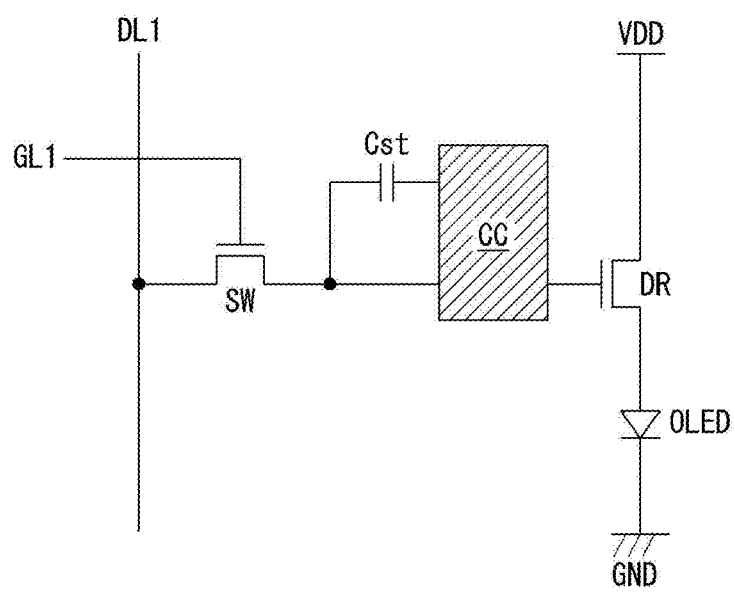
FIGS. 3 and 4 are schematic circuit diagrams of a subpixel of the organic light-emitting display shown in FIG. 2.
Figure 4:
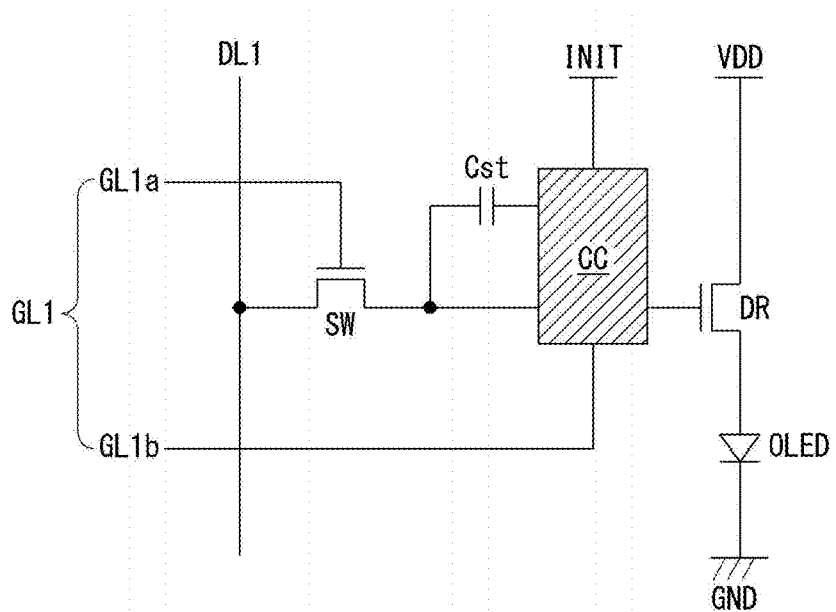

FIG. 2 is a schematic block diagram of an organic light-emitting display. FIGS. 3 and 4 show schematic configurations of a subpixel of the organic light-emitting display shown in FIG. 2.

Referring to FIG. 2, the organic light-emitting display includes an image processor 110, a timing controller 120, a data driver 130, a gate driver 140, and a display panel 150.

The image processor 110 outputs a data enable signal DE along with a data signal DATA supplied from the outside. The image processor 110 may output one or more of a vertical sync signal, a horizontal sync signal, and a clock signal in addition to the data enable signal DE, but such signals are not shown, for convenience of description. The image processor 110 is formed on a system circuit substrate in an integrated circuit (IC) form.

The timing controller 120 is supplied with a data enable signal DE or driving signals, including a vertical sync signal, a horizontal sync signal and a clock signal, along with a data signal DATA from the image processor 110.

The timing controller 120 outputs a gate timing control signal GDC for controlling operating timing of the gate driver 140 and a data timing control signal DDC for controlling operating timing of the data driver 130, based on a driving signal. The timing controller 120 is formed on a control circuit substrate in an IC form.

The data driver 130 converts a data signal DATA, supplied by the timing controller 120, into a gamma reference voltage by sampling and latching the data signal DATA in response to a data timing control signal DDC supplied by the timing controller 120, and outputs the gamma reference voltage. The data driver 130 outputs a data signal DATA through data lines DL1~DLn. The data driver 130 may be formed on a data circuit substrate in an IC form and attached to the display panel 150.

The gate driver 140 outputs a gate signal while shifting a level of a gate voltage in response to a gate timing control signal GDC supplied by the timing controller 120. The gate driver 140 outputs a gate signal through gate lines GL1~GLm. The gate driver 140 may be formed on a gate circuit substrate in an IC form and attached to the display panel 150 or may be formed on the display panel 150 in a gate-in-panel manner.

The display panel 150 includes a display area AA in which an image is implemented and a non-display area NA outside the display area AA. The display area AA includes subpixels SP. The subpixels may be defined by the intersection structure of signal lines.

The display panel 150 displays an image in accordance with a data signal DATA and gate signal supplied by the data driver 130 and the gate driver 140. The non-display area NA includes pads to which a circuit substrate is bonded and which receive a signal from the circuit substrate and link lines connected to the pads to transfer the signal to the subpixels SP of the display area AA.

Referring to FIG. 3, one subpixel includes a switching transistor SW, a driving transistor DR, a compensation circuit CC, and an OLED. The OLED operates to emit light in response to a driving current formed by the driving transistor DR.

The switching transistor SW performs a switching operation in response to a gate signal supplied through a first gate line GL1 so that a data signal supplied through a first data line DL1 is stored in a capacitor Cst as a data voltage. The driving transistor DR operates in response to a data voltage stored in the capacitor Cst so that a driving current flows between a high potential power source line VDD and a low potential power source line GND. The compensation circuit CC is a circuit for compensating for a threshold voltage of the driving transistor DR. Furthermore, the capacitor connected to the switching transistor SW or the driving transistor DR may be positioned within the compensation circuit CC.

The compensation circuit CC is configured with one or more thin film transistors (TFTs) and a capacitor. The configuration of the compensation circuit CC is very various depending on a compensation method, and a detailed example and description thereof are omitted.

Furthermore, as shown in FIG. 4, if a compensation circuit CC is included, a subpixel further includes a signal line and power source line for supplying a specific signal or power source, while driving a compensation TFT. The added signal line may be defined as a (1-2) gate line GL1b for driving the compensation TFT included in the subpixel. Furthermore, the added power source line may be defined as an initialization power source line INIT for initializing a specific node of the subpixel as a specific voltage, but this is only an example and the present disclosure is not limited thereto.

FIGS. 3 and 4 illustrate an example in which one subpixel includes the compensation circuit CC. However, if the subject of compensation is positioned outside a subpixel such as the data driver 130, the compensation circuit CC may be omitted. That is, one subpixel has 2transistor (2T) 1capacitor (1C) structure basically including a switching transistor SW, a driving transistor DR, a capacitor, and an OLED, but may be configured in various ways, such as 3T1C, 4T2C, 5T2C, 6T2C, 7T2C if a compensation circuit CC is added.

Figure 5:
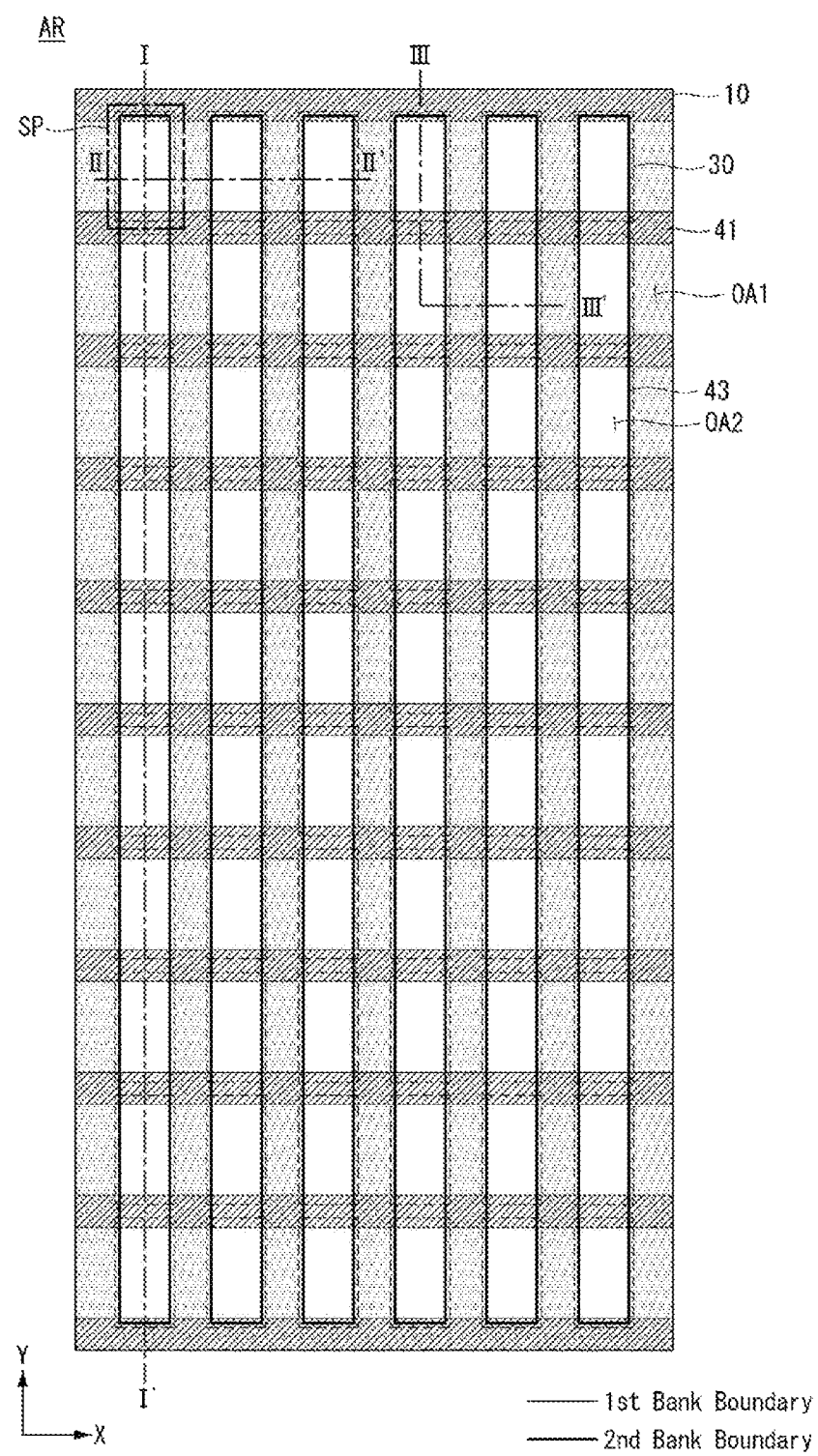
FIG. 5 is an enlarged plan view of an area AR of FIG. 2 schematically showing an organic light-emitting display according to a first aspect of the present disclosure.
Figure 6A:
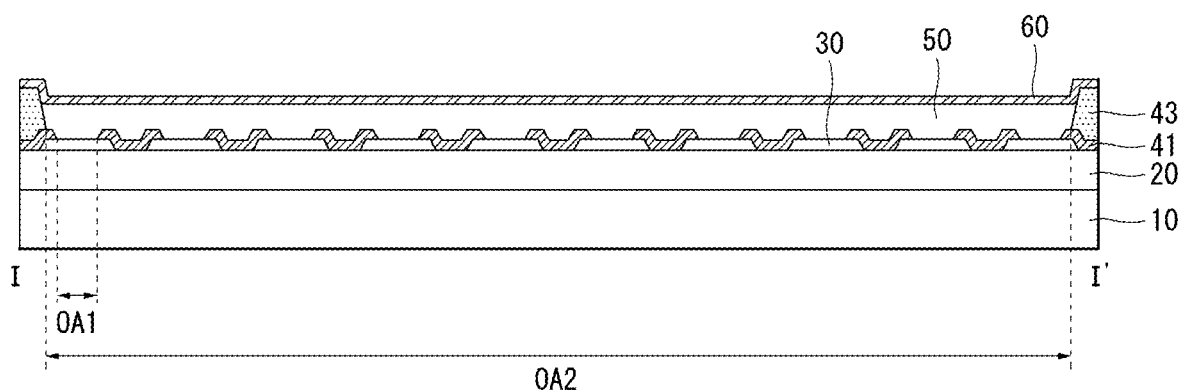
FIGS. 6A and 6B are respective cross-sectional views taken along lines I-I' and II-II' of FIG. 5.
Figure 6B:
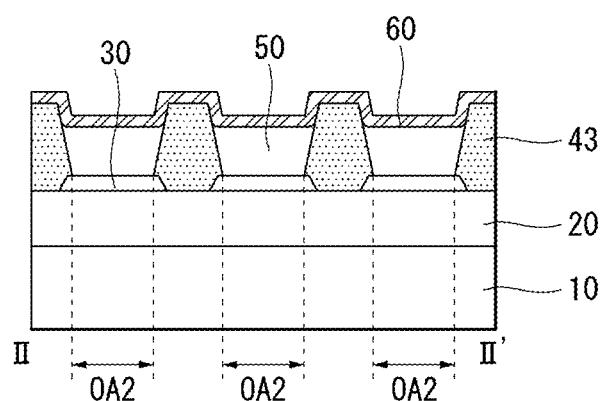

FIG. 5 is an enlarged plan view of an area AR of FIG. 2 schematically showing an organic light-emitting display according to a first aspect of the present disclosure, and, FIGS. 6A and 6B shows respective cross-sectional views taken along lines I-I' and II-II' of FIG. 5.

Referring to FIGS. 5 and 6, the organic light-emitting display according to the first aspect includes a substrate 10 having a display area AA in which subpixels SP have been arranged and a non-display area NA outside the display area. The substrate 10 may have various plane shapes. For example, as shown in the drawing, the substrate may include all plane shapes, such as a square, a circle, an oval and an oblong. A row direction (e.g., X-axis direction) and a column direction (e.g., Y-axis direction) that intercross each other regardless of a plane shape of the substrate 10 are defined in the substrate 10. The position and arrangement relation of a subpixel and/or an opening may be defined by the row direction and the column direction.

A circuit element layer 20 and an OLED driven by elements provided in the circuit element layer 20 are disposed on the substrate 10.

A signal line and electrodes for applying a driving signal to the OLED may be arranged in the circuit element layer 20. The signal line and the electrodes may be separated apart and positioned with at least one insulating layer interposed therebetween if necessary. If an organic light-emitting display is implemented as an active matrix (AM) manner, the circuit element layer 20 may further include a transistor allocated to each subpixel SP. The transistor may be implemented to have various structures, such as a top gate, a bottom gate, and a double gate structure. Furthermore, the transistor may be implemented in a p type or may be implemented in an n type. A semiconductor layer configured with the transistors may include amorphous silicon or polysilicon or oxide. Hereinafter, an OLED and a bank structure are first described, and a detailed example in which transistors are disposed is described later.

The OLED includes a first electrode 30, a second electrode 60, and an organic emission layer 50 interposed between the first electrode 30 and the second electrode 60. The first electrode 30 may be an anode, and the second electrode 60 may be a cathode.

More specifically, subpixels SP may be arranged in the row direction and the column direction which intercross each other. Subpixels SP adjacently arranged in the row direction may emit light of different colors, and subpixels SP adjacently arranged in the column direction may emit light of the same color. The first electrode 30 of the OLED is positioned in the subpixels SP. The first electrode 30 may be assigned to each of the subpixels SP.

A bank 40 is positioned on the first electrode 30. The bank 40 includes a first bank 41 and a second bank 43.

The first bank 41 includes a first opening OA1 exposing at least some of the first electrode 30. A plurality of the first openings OA1 is arranged in parallel in the column direction, and is extended in the row direction. The first opening OA1 is extended in the row direction, and exposes a plurality of the first electrodes 30 arranged in the row direction.

The first bank 41 is positioned between the first electrodes 30 adjacent in the column direction, and may partition subpixels SP adjacent in the column direction. The first bank 41 may be positioned to cover one side of the first electrodes 30 between the first electrodes 30 adjacent in the column direction.

The first bank 41 may be formed to a relatively thin thickness so that the first bank is covered by the organic emission layer 50 to be formed later. The first bank 41 may have a hydrophilic property. For example, the first bank 41 may be made of a hydrophilic inorganic insulating material, such as silicon oxide ($SiO_2$) and silicon nitride ($SiN_x$). The first bank 41 is a thin film made of a hydrophilic component provided to prevent a wettability failure attributable to the hydrophobic property of the first electrode 30, and functions to well spread a hydrophilic organic light-emitting material.

In the drawing, the first opening OA1 has been illustrated as having an approximately oblong, but is not limited thereto. Furthermore, all the first openings OA1 have been illustrated as having the same shape and area, but are not limited thereto. At least any one first opening OA1 may have a shape and/or area different from that of another first opening OA1.

The second bank 43 is positioned on the substrate 10 in which the first bank 41 has been formed. The second bank 43 includes a second opening OA2 exposing at least some of the first electrode 30. A plurality of the second openings OA2 is arranged in parallel in the row direction, and is extended in the column direction. The second opening OA2 is extended in the column direction, and exposes the plurality of first electrodes 30 disposed in the column direction.

The second bank 43 is positioned between first electrodes 30 adjacent in the row direction, and may partition subpixels SP adjacent in the row direction. The second bank 43 may be positioned to cover one side of first electrodes 30 between the first electrodes 30 adjacent in the row direction.

The second bank 43 may have a hydrophobic property. Alternatively, the top of the second bank 43 may have a hydrophobic property, and the side thereof may have a hydrophilic property. For example, the second bank 43 may have a form in which a hydrophobic material has been coated on an insulating material, and may be made of an insulating material containing a hydrophobic material. The second bank 43 may be made of an organic material. The hydrophobic property of the second bank 43 may function to push an organic light-emitting material configuring the organic emission layer 50 so that the organic light-emitting material gathers at the central part of an emission area. Furthermore, the second bank 43 may function as a barrier for confining an organic light-emitting material dropped on a corresponding area in order to prevent organic light-emitting materials of different colors from being mixed.

In the drawing, the second opening OA2 has been illustrated as having an approximately oblong, but is not limited thereto. Furthermore, all the second openings OA2 have been illustrated as having the same shape and area, but are not limited thereto. At least any one second opening OA2 may have a shape and/or area different from that of another second opening OA2. For example, the shape and/or area of the second opening OA2 may be properly selected by taking into consideration the lifespan of an organic light-emitting material.

The organic emission layer 50 is positioned on the substrate 10 in which the second bank 43 has been formed. The organic emission layer 50 may be formed within the corresponding second opening OA2 in the direction in which the second opening OA2 is extended. That is, an organic light-emitting material dropped within one second opening OA2 covers the first electrodes 30 and the first banks 41 exposed by the second opening OA2. The organic emission layer 50 formed within the second opening OA2 after a curing process is not physically separated by the first bank 41, and maintains continuity on the first bank 41.

An organic light-emitting material of the same color is dropped on a plurality of the first electrodes 30 exposed by one second opening OA2. This means that light of the same color is emitted from a plurality of subpixels SP allocated to positions corresponding to one second opening OA2. The plane shape of the organic emission layer 50 may correspond to the plane shape of the second opening OA2.

Organic light-emitting materials of different colors may be sequentially dropped on corresponding second openings OA2 alternately. The organic light-emitting materials of different colors may include organic light-emitting materials which emit red (R), green (G), and blue (B). In some aspects, an organic light-emitting material that emits white (W) may be included. The organic light-emitting materials of different colors dropped on different second openings OA2 are physically separated by the second bank 43.

In the first aspect of the present disclosure, a thickness irregularity phenomenon attributable to the above-described pile-up phenomenon after curing can be improved because the organic light-emitting material can be spread in a uniform thickness in a wide area on the second opening OA2 extended in the column direction. Accordingly, the organic light-emitting display according to the first aspect of the present disclosure can reduce display quality degradation attributable to a thickness deviation within a subpixel SP because a reduction in the uniformity of the organic emission layer 50 can be prevented. Furthermore, a reduction in the lifespan of a device or a failure, such as the occurrence of a dark point, can be prevented because the uniformity of the organic emission layer 50 is secured.

Figure 7:
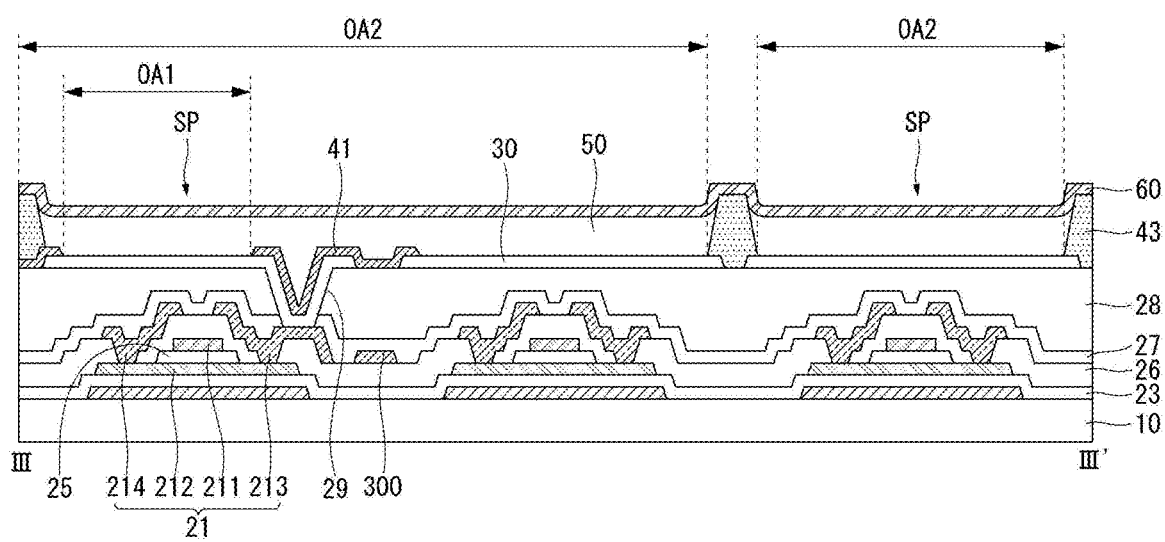
FIG. 7 is a cross-sectional view taken along line III-III' of FIG. 5 for illustrating an exemplary configuration of a transistor and an organic light-emitting display.

FIG. 7 is a cross-sectional view taken along line III-III' of FIG. 5 illustrating an exemplary configuration of a transistor and an OLED.

Referring to FIG. 7, the circuit element layer 20 and an OLED positioned on the circuit element layer 20 are disposed on the substrate 10. The circuit element layer 20 may include a transistor 21 electrically connected to the OLED. For example, a light blocking layer 22 is positioned on the substrate 10. The light blocking layer 22 functions to prevent a photocurrent from occurring in the transistor by blocking the incidence of external light. A buffer layer 23 is positioned on the light blocking layer 22. The buffer layer 23 functions to protect the transistor, formed in a subsequent process, against impurities, such as alkali ions drained from the light blocking layer 22. The buffer layer 23 may be a silicon oxide (SiOx) layer, a silicon nitride (SiNx) layer or a multiple layer of them.

The semiconductor layer 212 of the transistor 21 is positioned on the buffer layer 23. The semiconductor layer 212 may be made of a silicon semiconductor or an oxide semiconductor. The silicon semiconductor may include amorphous silicon or crystallized polysilicon silicon. The semiconductor layer 212 includes a drain area and source area including p or n type impurities, and includes a channel between the drain area and the source area.

A gate insulating film 25 is positioned on the semiconductor layer 212. The gate insulating film 25 may be a silicon oxide (SiOx) film, a silicon nitride (SiNx) film or a multiple film of them. A gate electrode 211 is positioned in a given area of the semiconductor layer 212 on the gate insulating film 25, that is, a position corresponding to a channel when impurities have been implanted. The gate electrode 211 is formed using any one selected from the group consisting of molybdenum (Mo), aluminum (Al), chrome (Cr), gold (Au), titanium (Ti), nickel (Ni), neodymium (Nd), and copper (Cu) or an alloy of them. Furthermore, the gate electrode 211 may be a multiple layer made of any one selected from the group consisting of molybdenum (Mo), aluminum (Al), chrome (Cr), gold (Au), titanium (Ti), nickel (Ni), neodymium (Nd), and copper (Cu) or an alloy of them. For example, the gate electrode 211 may be molybdenum/aluminum/neodymium or a dual layer of molybdenum/aluminum.

An interlayer dielectric film 26 for insulating the gate electrode 211 is positioned on the gate electrode 211. The interlayer dielectric film 26 may be a silicon oxide (SiOx) film, a silicon nitride (SiNx) film or a multiple layer of them. A source electrode 213 and a drain electrode 214 are disposed on the interlayer dielectric film 26. The source electrode 213 and the drain electrode 214 are connected to the semiconductor layer 212 through a contact hole that exposes the source area of the semiconductor layer 212. The source electrode 213 and the drain electrode 214 may be configured with a single layer or a multiple layer. If the source electrode 213 and the drain electrode 214 are configured with a single layer, they may be made of any one selected from the group consisting of molybdenum (Mo), aluminum (Al), chrome (Cr), gold (Au), titanium (Ti), nickel (Ni), neodymium (Nd), and copper (Cu) or an alloy of them. Furthermore, if the source electrode 213 and the drain electrode 214 are configured with a multiple layer, they may be a dual layer of molybdenum/aluminum/neodymium or a triple layer of titanium/aluminum/titanium, molybdenum/aluminum/molybdenum or molybdenum/aluminum-neodymium/molybdenum. Accordingly, the transistor 21, including the semiconductor layer 212, the gate electrode 211, the source electrode 213, and the drain electrode 214, is configured. Furthermore, in the capacitor lower electrode 24, the drain electrode 214 acts as a capacitor upper electrode to configure a capacitor Cst.

A passivation film 27 is positioned on the substrate 10, including the transistor 21 and the capacitor Cst. The passivation film 27 is an insulating film for protecting underlying elements, and may be a silicon oxide (SiOx) film, a silicon nitride (SiNx) film or a multiple layer of them. An overcoat layer 28 is positioned on the passivation film 27. The overcoat layer 28 may be a planarization film for reducing the step of an underlying structure, and is made of an organic matter, such as polyimide, benzocyclobutene series resin or acrylate. A subpixel contact hole 29 exposing the source electrode 213 by exposing the passivation film 27 is positioned in some area of the overcoat layer 28.

An OLED is formed on the overcoat layer 28. The OLED includes the first electrode 30 connected to the transistor, the second electrode 60 opposite the first electrode 30, and the organic emission layer 50 interposed between the first electrode 30 and the second electrode 60. The first electrode 30 may be an anode electrode, and the second electrode 60 may be a cathode electrode.

The first electrode 30 is positioned on the overcoat layer 28, and may be connected to the source electrode 213 of the transistor through the subpixel contact hole 29 which penetrates the overcoat layer 28. One first electrode 30 may be allocated to each subpixel, but the present disclosure is not limited thereto. The first electrode 30 may be made of a transparent conductive material, such as indium tin oxide (ITO), indium zinc oxide (ZTO) or zinc oxide (ZnO), in accordance with an adopted emission method, thus functioning as a transparent electrode. Alternatively, the first electrode may include a reflection layer, thus functioning as a reflection electrode. The reflection layer may be made of aluminum (Al), copper (Cu), silver (Ag), nickel (Ni) or an alloy of them, and may be made of a silver/palladium/copper (APC) alloy.

The bank 40 is positioned on the substrate 10 in which the first electrode 30 has been formed. The bank 40 includes the first bank 41 and the second bank 43. The first bank 41 and the second bank 43 include respective openings which expose most of the first electrode 30.

The organic emission layer 50 is positioned on the substrate 10 in which the bank 40 has been formed. The organic emission layer 50 includes an emission layer EML, and may further include any one or more of a hole injection layer HIL, a hole transport layer HTL, an electron transport layer ETL and an electron injection layer EIL. The bank 40 includes the first bank 41 and the second bank 43.

The first bank 41 includes the first opening OA1 exposing a plurality of first electrodes 30 arranged in the row direction. The second bank 43 includes the second opening OA2 exposing a plurality of first electrodes 30 arranged in the column direction.

Signal lines 300 connected to the transistor 21, for applying a driving signal to a corresponding subpixel, may be disposed in the area in which the first bank 41 has been positioned and the area in which the second bank 43 has been positioned. The signal lines 300 may include a gate line for applying a gate signal to a subpixel, a data line for applying a data signal, a high potential power source line for applying a high potential power source, and a low potential power source line for applying a low potential power source. In some aspects, if a compensation circuit is applied to a subpixel, the signal lines 300 may further include a sensing line for sensing electrical characteristics of the subpixel.

The signal lines 300 are disposed to overlap the first bank 41, and may be extended to cross between first electrodes 30 adjacent in the column direction. And/or the signal lines 300 are disposed to overlap the second bank 43, and may be extended to cross between first electrodes 30 adjacent in the row direction.

The signal lines 300 may be formed in different layers with at least one insulating layer 23, 26, 27, 28 interposed therebetween in an area corresponding to the first bank 41 and/or the second bank 43. For example, the gate lines may be disposed in the same layer as the gate electrode 211. The data line, the high potential power source line, and the low potential power source line may be disposed in the same layer as the source/drain electrodes 213 and 214. The sensing lines may be disposed in the same layer as the source/drain electrodes 213 and 214 or may be disposed in the same layer as the light blocking layer 22. In some aspects, any one of the signal lines 300 may be divided into a plurality of lines disposed in different layers. The plurality of divided lines may be electrically connected through contact holes, which penetrate an insulating layer positioned between the lines.

As shown in the drawing, the first bank 41 may be positioned to cover the subpixel contact hole 29. An area shielded by the first bank 41 corresponds to a non-emission area. Accordingly, although a thickness deviation partially occurs in the organic emission layer due to a step attributable to the subpixel contact hole 29, display quality may not be influenced, but the present disclosure is not limited thereto. For example, the second bank 43 may be positioned to cover the subpixel contact hole 29.

The second electrode 60 is positioned on the organic emission layer 50. The second electrode 60 may be widely formed on the entire surface of the substrate 10. The second electrode 60 may function as a transparent electrode or reflection electrode in accordance with an adopted emission method. If the second electrode 60 is a transparent electrode, the second electrode 60 may be formed using a transparent conductive material, such as indium tin oxide (ITO) or indium zinc oxide (ZTO), and may be made of magnesium (Mg), calcium (Ca), aluminum (Al), or silver (Ag) or an alloy of them having a thin thickness to the extent that light can transmit. The subpixel structure of FIG. 7 may be identically applied to other subpixels.

Figure 8A:
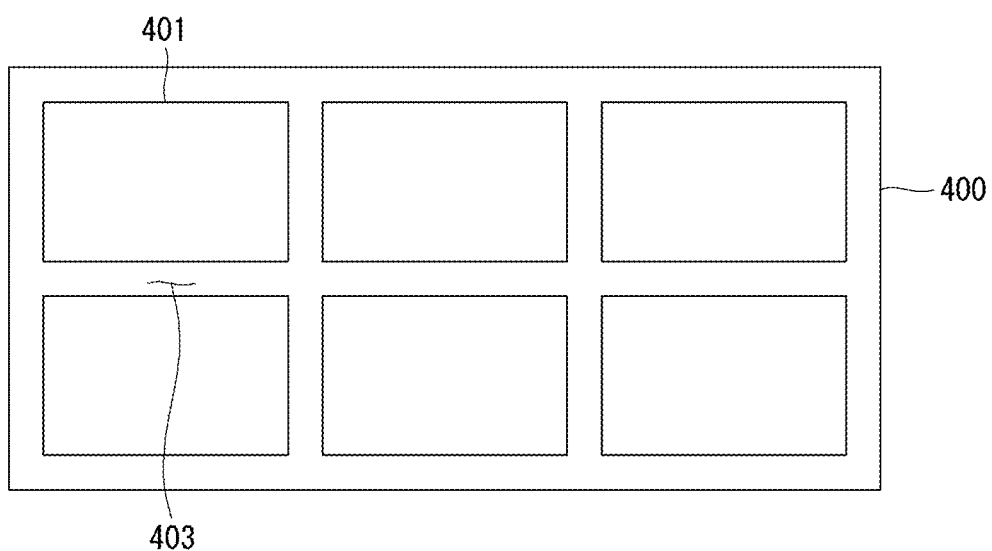
FIG. 8A is a diagram for illustrating a problem which may occur due to a dry difference according to the position of an organic light-emitting material when a solution process is performed.

FIG. 8A is a diagram for illustrating a problem which may occur due to a dry difference according to the position of an organic light-emitting material when a solution process is performed.

Referring to FIG. 8A, a mother substrate 400 is a substrate for fabricating a plurality of organic light-emitting displays, for convenience of process. The plurality of organic light-emitting displays may be formed on the mother substrate 400 at the same time and may be individually separated through a trimming process. For example, a driving element and emission elements configuring an organic light-emitting display may be formed on a plurality of unit cells 401 on the mother substrate 400 at the same time. Thereafter, the plurality of unit cells may be individually separated through a trimming process. Each of the separated unit cells 401 is connected to a driver for supplying a driving signal and a power source, thus functioning as an organic light-emitting display.

The above-described manufacturing process includes a solution process for forming an organic emission layer on the mother substrate 400. That is, as described in the first aspect, the manufacturing process includes a process of dropping an organic light-emitting material on the second opening exposing a plurality of the first electrodes and forming the organic emission layer through a dry process.

Figure 8B:
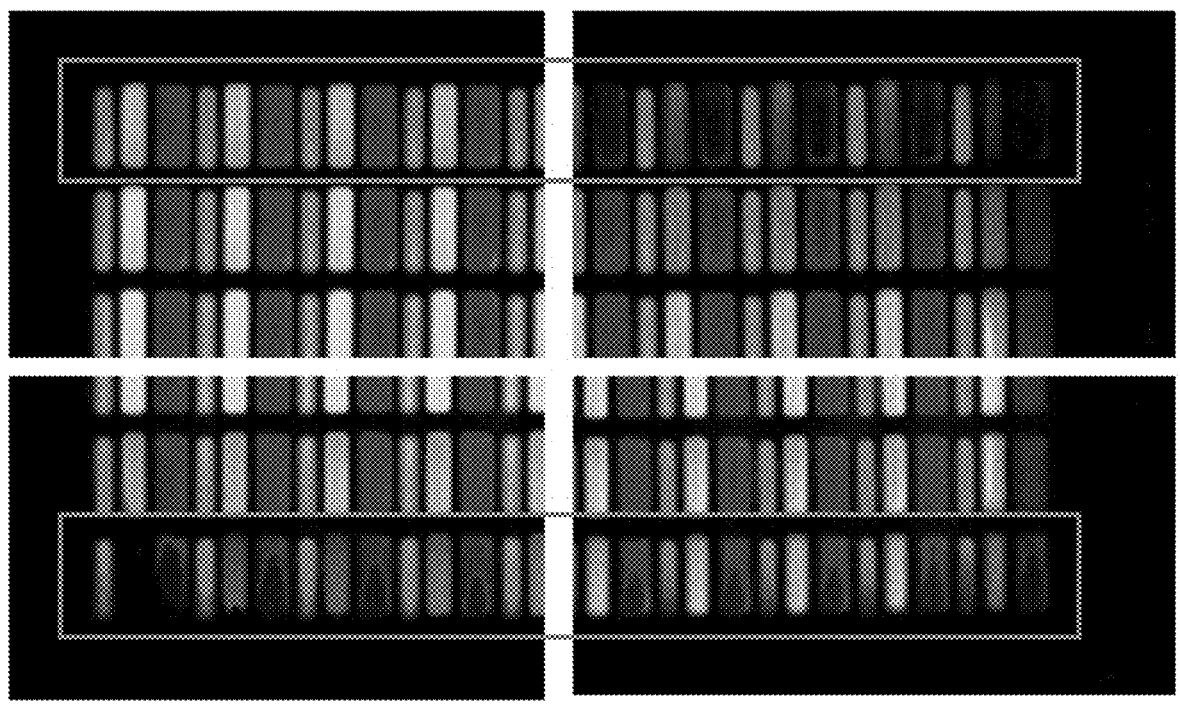
FIGS. 8B and 8C are diagrams showing a stain failure occurred at the edge part of a completed organic light-emitting display.
Figure 8C:
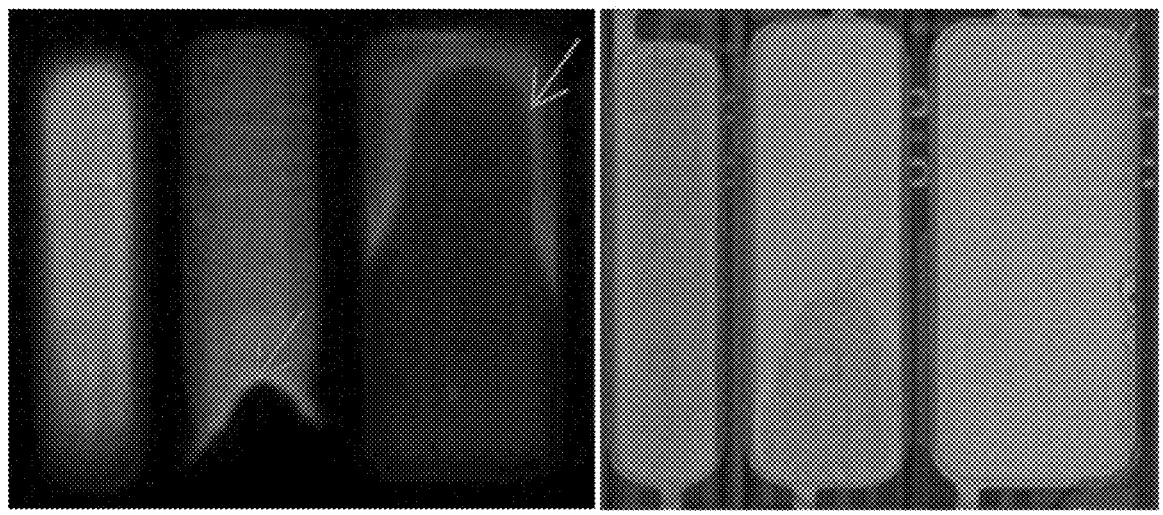

In this case, a failure in which the organic emission layer is formed in an irregular thickness at the edge part of the unit cell 401 may occur due to a dry speed difference according to the position of the dropped organic light-emitting material. For example, a difference between internal flow velocities occurs because the dry speed of the organic light-emitting material is fast at an edge part neighboring a joint 403 between the unit cells 401. Accordingly, there may be a problem in that solid contents gather in one direction. That is, when the organic light-emitting material drops on the second opening, solid contents may flow along the second opening having a wide area due to a dry speed difference in the edge part, so the solid contents may gather in one side direction (e.g., the central direction of the unit cell 401). Accordingly, the organic emission layer 50 having an irregular thickness is formed at the edge part of the unit cell 401, which is viewed as an edge part stain by a user. Accordingly, there is a problem in that display quality is significantly degraded. FIGS. 8B and 8C are diagrams showing a stain failure occurred at the edge part of a completed organic light-emitting display.

Hereinafter, an aspect of the present disclosure proposes a new structure capable of improving a stain failure occurred at the edge part of an organic light-emitting display.

Figure 9:
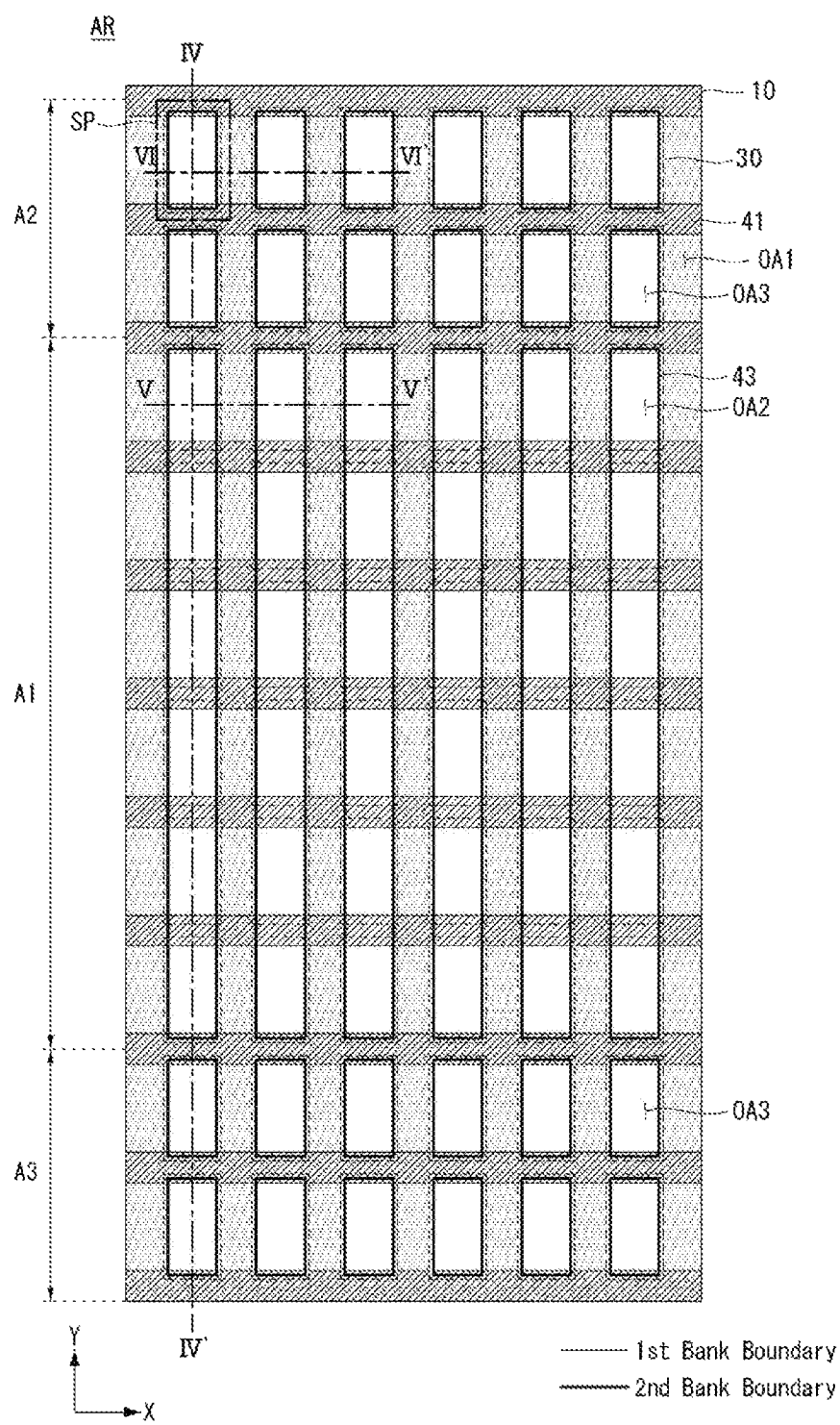
FIG. 9 is an enlarged plan view of the area AR of FIG. 2 schematically showing an organic light-emitting display according to a second aspect of the present disclosure.
Figure 10A:
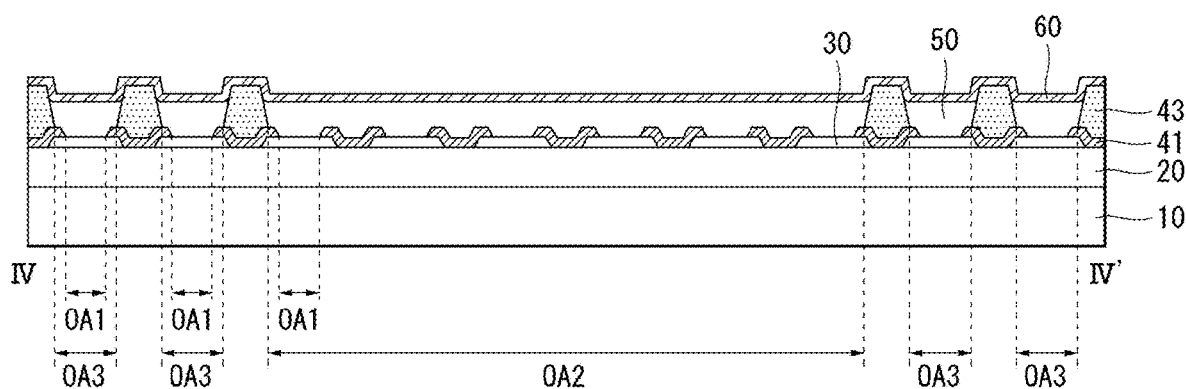
FIGS. 10A, 10B and 10C are respective cross-sectional views taken along lines IV-IV', V-V' and VI-VI' of FIG. 9.
Figure 10B:
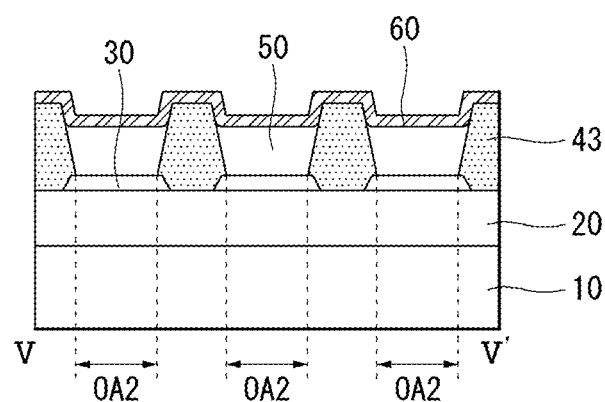
Figure 10C:
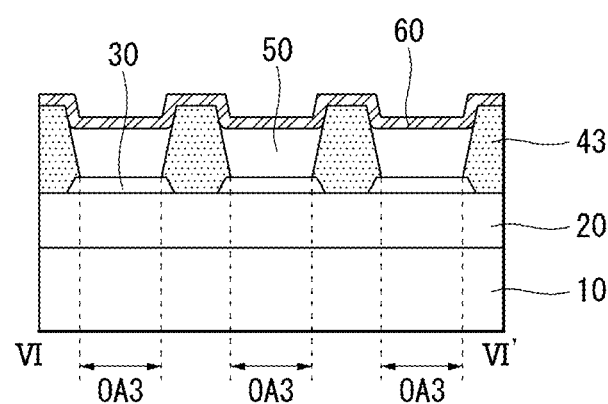

FIG. 9 is an enlarged plan view of the area AR of FIG. 2 schematically showing an organic light-emitting display according to a second aspect of the present disclosure. FIGS. 10A to 10C shows respective cross-sectional views taken along lines IV-IV', V-V' and VI-VI' of FIG. 9.

Referring to FIGS. 9 and 10A to 10C, the organic light-emitting display according to the second aspect includes a substrate 10 having a display area AA in which subpixels SP have been arranged and a non-display area NA outside the display area. The substrate 10 may have various plane shapes. For example, as shown in the drawing, the substrate may include all plane shapes, such as a square, a circle, and an oval, in addition to an oblong. A row direction (e.g., X-axis direction) and a column direction (e.g., Y-axis direction) that intercross each other regardless of a plane shape of the substrate 10 are defined in the substrate 10. The position and arrangement relation of a subpixel and/or an opening may be defined by the row direction and the column direction.

A circuit element layer 20 and an OLED driven by elements provided in the circuit element layer 20 are disposed on the substrate 10.

A signal line and electrodes for applying a driving signal to the OLED may be arranged in the circuit element layer 20. The signal line and the electrodes may be separated and positioned with at least one insulating layer interposed therebetween, if necessary. If an organic light-emitting display is implemented in an active matrix (AM) manner, the circuit element layer 20 may further include a transistor allocated to each subpixel SP. The transistor may be implemented to have various structures, such as a top gate, a bottom gate, and a double gate structure. Furthermore, the transistor may be implemented in a p type or may be implemented in an n type. A semiconductor layer configured with the transistors may include amorphous silicon or polysilicon or oxide. For example, a detailed structure of the transistor may be implemented as the structure of FIG. 7, but is not limited thereto.

The OLED includes a first electrode 30, a second electrode 60, and an organic emission layer 50 interposed between the first electrode 30 and the second electrode 60. The first electrode 30 may be an anode, and the second electrode 60 may be a cathode.

More specifically, a plurality of subpixels is arranged on the substrate 10. The subpixels SP may be arranged in the row direction and the column direction which intercross each other. Subpixels SP adjacently arranged in the row direction may emit light of different colors, and subpixels SP adjacently arranged in the column direction may emit light of the same color.

The substrate 10 includes a first area A1, a second area A2, and a third area A3. The first area A1 is defined at the central part of the substrate 10. The second area A2 is an area neighboring the first area A1 in the column direction, and is defined at an edge part on one side of the substrate 10. The third area A3 is an area neighboring the first area A1 in the column direction, and is defined at an edge part on the other side of the substrate 10. That is, the second area A2 and the third area A3 neighbor the first area A1 in the column direction, and may be defined at the edge parts on both sides of the first area A1. Accordingly, the second area A2, the first area A1, and the third area A3 are sequentially disposed on the substrate 10 in the column direction.

The number of rows allocated to the first area A1 is set greater than the number of rows allocated to the second area A2 and the number of rows allocated to the third area A3. In the drawing, a case where a plurality of subpixels SP arranged in six rows is allocated to the first area A1, a plurality of subpixels SP arranged in two rows is allocated to the second area A2, and a plurality of subpixels SP arranged in two rows is allocated to the third area A3 has been illustrated, but the present disclosure is not limited thereto. For example, the number of rows allocated to the second area A2 and the number of rows allocated to the third area A3 may be different.

The first electrode 30 of an OLED is positioned in the subpixels SP. The first electrode 30 may be allocated to each of the subpixels SP.

A bank 40 is positioned on the first electrode 30. The bank 40 includes a first bank 41 and a second bank 43.

The first bank 41 includes a first opening OA1 exposing at least some of the first electrode 30. A plurality of the first openings OA1 is arranged in parallel in the column direction, and is extended in the row direction. The first opening OA1 is extended in the row direction, and exposes a plurality of the first electrodes 30 arranged in the row direction.

The first bank 41 is positioned between the first electrodes 30 adjacent in the column direction, and may partition subpixels SP adjacent in the column direction. The first bank 41 may be positioned to cover one side of the first electrodes 30 between the first electrodes 30 adjacent in the column direction.

The first bank 41 may be formed in a relatively thin thickness so that the first bank is covered by the organic emission layer 50 to be formed later. The first bank 41 may have a hydrophilic property. For example, the first bank 41 may be made of a hydrophilic inorganic insulating material, such as silicon oxide (SiO2) or silicon nitride (SiNx). The first bank 41 is a thin film made of a hydrophilic component provided to prevent a wettability failure attributable to the hydrophobic property of the first electrode 30, and functions to well spread a hydrophilic organic light-emitting material.

In the drawing, the first opening OA1 has been illustrated as having an approximately oblong, but is not limited thereto. Furthermore, all the first openings OA1 have been illustrated as having the same shape and area, but are not limited thereto. At least any one first opening OA1 may have a shape and/or area different from that of another first opening OA1.

The second bank 43 is positioned on the substrate 10 in which the first bank 41 has been formed. The second bank 43 includes a second opening OA2 and third opening OA3 exposing at least some of the first electrode 30. Hereinafter, an example in which the third opening OA3 is formed in both the second area A2 and the third area A3 is described, for convenience of description, but the present disclosure is not limited thereto. For example, the third opening OA3 may be selectively formed in at least one of the second area A2 or the third area A3.

In the first area A1, the second bank 43 may be positioned between first electrodes 30 adjacent in the row direction to partition subpixels SP adjacent in the row direction. The second bank 43 may be positioned to cover one side of the first electrodes 30 between the first electrodes 30 adjacent in the row direction.

The second openings OA2 are disposed in the first area A1. The second openings OA2 are extended in the column direction and arranged in parallel in the row direction. The second opening OA2 are extended in the column direction to expose a plurality of first electrodes 30 disposed in the column direction. That is, a plurality of first electrodes 30 arranged in column direction is allocated to one second opening OA2.

In the second area A2 and the third area A3, the second bank 43 may be positioned between first electrodes 30 adjacent in the row direction and positioned between first electrodes 30 adjacent in the column direction to partition subpixels SP adjacent in the row direction and the column direction. The second bank 43 may be positioned to cover one side of the first electrodes 30 between the first electrodes 30 adjacent in the row direction and the column direction.

One third opening OA3 may be allocated to one first electrode 30. The second bank 43 may be formed to cover the edge of the first electrode 30 in the second area A2 and the third area A3, thus exposing most of the central part of the first electrode 30.

The boundary of the third opening OA3 may be positioned inside the boundary of the first electrode 30. The boundary of the third opening OA3 determines a plane shape of the third opening OA1. The boundary of the first electrode 30 determines a plane shape of the first electrode 30. The boundary of the third opening OA3 may be spaced apart at a preset interval inside the boundary of the first electrode 30.

The second bank 43 may have a hydrophobic property. Alternatively, the top of the second bank 43 may have a hydrophobic property, and the side thereof may have a hydrophilic property. For example, the second bank 43 may have a form in which a hydrophobic material has been coated on an insulating material, and may be made of an insulating material containing a hydrophobic material. The second bank 43 may be made of an organic material. The hydrophobic property of the second bank 43 may function to push an organic light-emitting material configuring the organic emission layer 50 so that the organic light-emitting material gathers at the central part of an emission area. Furthermore, the second bank 43 may function as a barrier for confining an organic light-emitting material dropped on a corresponding area in order to prevent organic light-emitting materials of different colors from being mixed.

In the drawing, the second opening OA2 and the third opening OA3 have been illustrated as having an approximately oblong, but is not limited thereto. Furthermore, all the second openings OA2 have been illustrated as having the same shape and area, but are not limited thereto. At least any one second opening OA2 may have a shape and/or area different from that of another second opening OA2. Furthermore, all the third openings OA3 have been illustrated as having the same shape and area, but are not limited thereto. At least any one third opening OA3 may have a shape and/or area different from that of another third opening OA3. For example, the shape and/or area of the second opening OA2 and the third opening OA3 may be properly selected by taking the lifespan of an organic light-emitting material into consideration.

An organic emission layer 50 is positioned on the substrate 10 in which the second bank 43 has been formed. The organic emission layer 50 is formed over each of the second opening OA2 and the third opening OA3. The organic emission layers 50 formed in the second opening OA2 and the third opening OA3 adjacent in the column direction emit light of the same color. The organic emission layers 50 formed in the second openings OA2 adjacent in the row direction emit light of different colors. The organic emission layers 50 formed in the third openings OA3 adjacent in the row direction emit light of different colors.

The organic emission layer 50 may be formed in the direction in which the second opening OA2 elongates within a corresponding second opening OA2 in the first area A1. That is, an organic light-emitting material dropped to one second opening OA2 covers the first electrodes 30 and the first banks 41 exposed by the one second opening OA2. The organic emission layer 50 formed within the second opening OA2 after a curing process is not physically separated by the first bank 41, but maintains continuity on the first bank 41.

Organic light-emitting materials having the same color are dropped on a plurality of first electrodes 30 exposed by one second opening OA2. This means that light of the same color is emitted from a plurality of subpixels SP allocated to positions corresponding to the one second opening OA2. A plane shape of the organic emission layer 50 formed in the second opening OA2 may correspond to a plane shape of the second opening OA2.

The organic emission layer 50 may be formed within a corresponding third opening OA3 in the second area A2 and the third area A3. A plane shape of the organic emission layer 50 formed in the third opening OA3 may correspond to a plane shape of the third opening OA3.

In the first area A1, organic light-emitting materials of different colors may be sequentially dropped to corresponding second openings OA2 alternately in the row direction. In the second area A2 and the third area A3, organic light-emitting materials of different colors may be sequentially dropped to corresponding third openings OA3 alternately in the row direction.

The organic light-emitting materials of different colors may include organic light-emitting materials emitting red (R), green (G), and blue (B). In some aspects, the organic light-emitting materials may include an organic light-emitting material emitting white (W).

In the second aspect of the present disclosure, the third opening OA3 having a narrower area than the second opening OA2 is allocated to the second area A2 and the third area A3, that is, edge parts. In this case, as described in FIGS. 8B and 8C, although a dry difference between organic light-emitting materials occurs at an edge part, it can be restricted by the hydrophobic property of the second bank 43 within the third opening OA3 having an area in which a flow of solid contents attributable to an internal flow velocity difference is relatively narrow. Accordingly, a problem in that the organic emission layer 50 is formed in an irregular thickness at the edge part can be reduced.

The second aspect of the present disclosure has an advantage in that it can significantly improve a stain failure attributable to the thickness irregularity of the organic emission layer 50 at the edge part. Accordingly, an organic light-emitting display having improved display quality can be provided.

Figure 11:
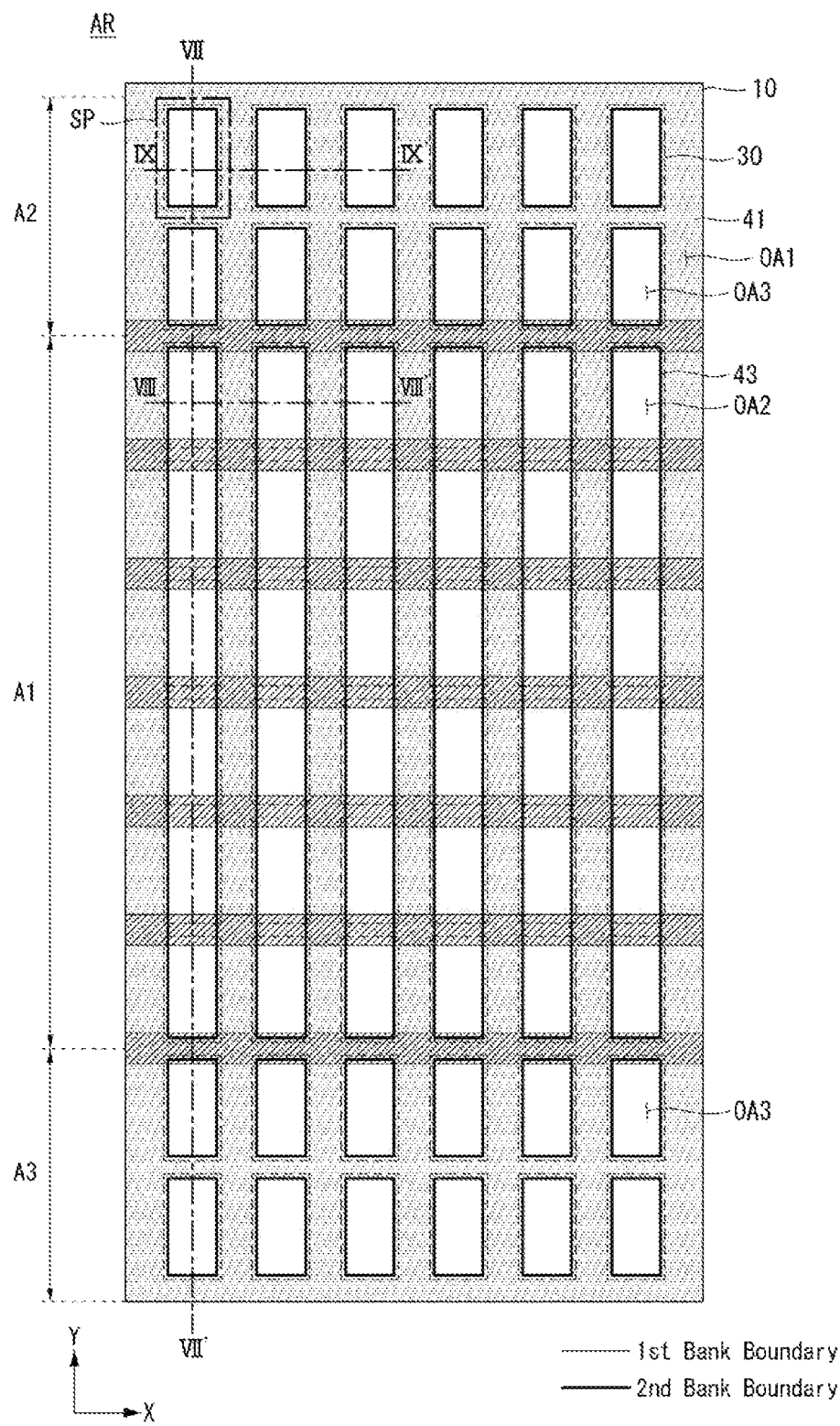
FIG. 11 is an enlarged plan view of the AR area of FIG. 2 schematically showing an organic light-emitting display according to a third aspect of the present disclosure.
Figure 12A:
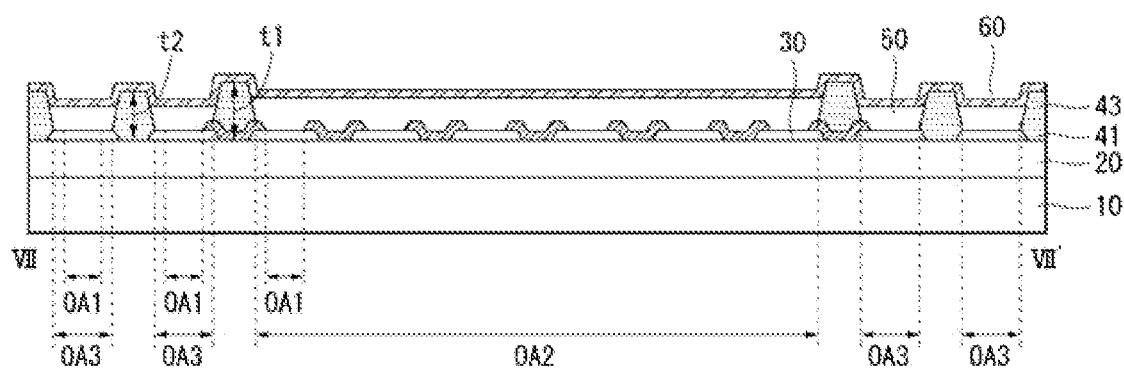
FIGS. 12A, 12B and 12C are respective cross-sectional views taken along lines VII-VII', VIII-VIII' and IX-IX' of FIG. 11.
Figure 12B:
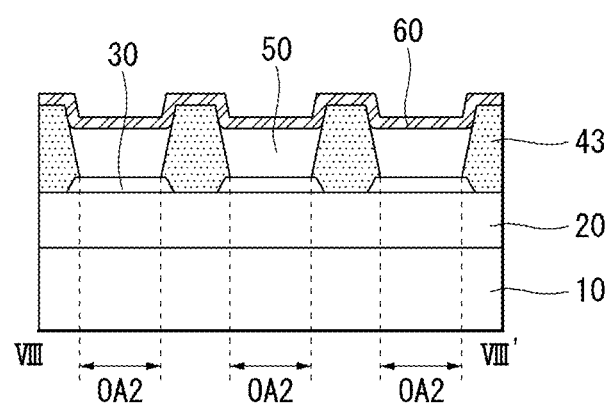
Figure 12C:
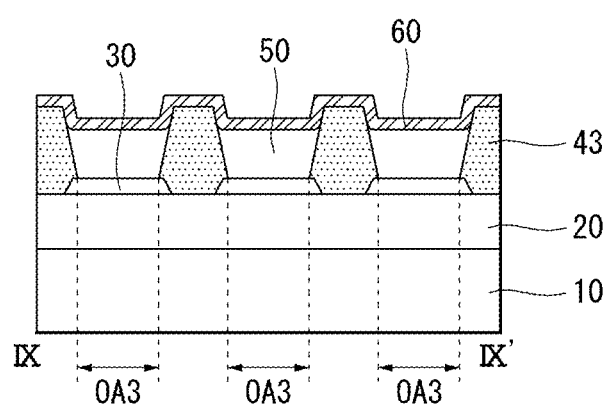
Figure 13:
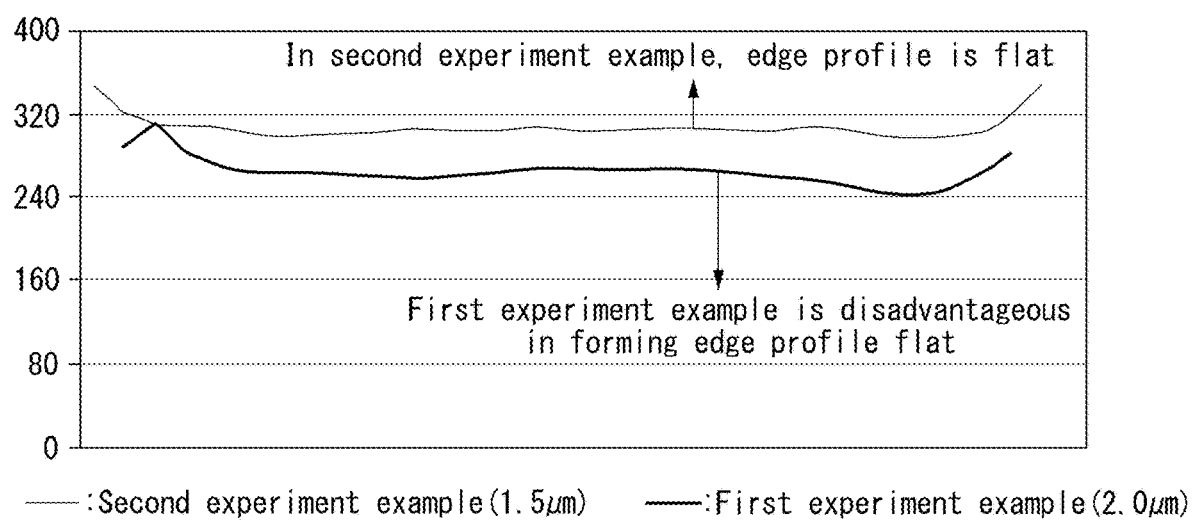
FIG. 13 shows experiment data for illustrating thickness uniformity of an organic emission layer with respect to the bank thickness.

FIG. 11 is an enlarged plan view of the area AR of FIG. 2 schematically showing an organic light-emitting display according to a third aspect of the present disclosure. FIG. 12 shows cross-sectional views taken along lines VII-VII', VII-VII' and IX-IX' of FIG. 11. FIG. 13 shows experiment data for illustrating thickness uniformity of an organic emission layer with respect to the bank thickness. In describing third aspect, a description of substantially the same elements as those of the second aspect may be omitted.

Referring to FIG. 11 and FIGS. 12A to 12C, the organic light-emitting display according to the third aspect includes a substrate 10 having a display area AA in which subpixels SP have been arranged and a non-display area NA outside the display area. The substrate 10 may have various plane shapes. For example, as shown in the drawing, the substrate may include all plane shapes, such as a square, a circle, and an oval, in addition to an oblong. A row direction (e.g., X-axis direction) and a column direction (e.g., Y-axis direction) that intercross each other regardless of a plane shape of the substrate 10 are defined in the substrate 10. The position and arrangement relation of a subpixel and/or an opening may be defined by the row direction and the column direction.

A circuit element layer 20 and an OLED driven by elements provided in the circuit element layer 20 are disposed on the substrate 10.

A signal line and electrodes for applying a driving signal to the OLED may be arranged in the circuit element layer 20. The signal line and the electrodes may be separated and positioned with at least one insulating layer interposed therebetween, if necessary. If an organic light-emitting display is implemented in an active matrix (AM) manner, the circuit element layer 20 may further include a transistor allocated to each subpixel SP. The transistor may be implemented to have various structures, such as a top gate, a bottom gate, and a double gate structure. Furthermore, the transistor may be implemented in a p type or may be implemented in an n type. A semiconductor layer configured with the transistors may include amorphous silicon or polysilicon or oxide. For example, a detailed structure of the transistor may be implemented as the structure of FIG. 7, but is not limited thereto.

The OLED includes a first electrode 30, a second electrode 60, and an organic emission layer 50 interposed between the first electrode 30 and the second electrode 60. The first electrode 30 may be an anode, and the second electrode 60 may be a cathode.

More specifically, a plurality of subpixels is arranged on the substrate 10. The subpixels SP may be arranged in the row direction and the column direction which intercross each other. Subpixels SP adjacently arranged in the row direction may emit light of different colors, and subpixels SP adjacently arranged in the column direction may emit light of the same color.

The substrate 10 includes a first area A1, a second area A2, and a third area A3. The first area A1 is defined at the central part of the substrate 10. The second area A2 is an area neighboring the first area A1 in the column direction, and is defined at an edge part on one side of the substrate 10. The third area A3 is an area neighboring the first area A1 in the column direction, and is defined at an edge part on the other side of the substrate 10. That is, the second area A2 and the third area A3 neighbor the first area A1 in the column direction, and may be defined at the edge parts on both sides of the first area A1. Accordingly, the second area A2, the first area A1, and the third area A3 are sequentially disposed on the substrate 10 in the column direction.

The number of rows allocated to the first area A1 is set greater than the number of rows allocated to the second area A2 and the number of rows allocated to the third area A3. In the drawing, a case where a plurality of subpixels SP arranged in six rows is allocated to the first area A1, a plurality of subpixels SP arranged in two rows is allocated to the second area A2, and a plurality of subpixels SP arranged in two rows is allocated to the third area A3 has been illustrated, but the present disclosure is not limited thereto. For example, the number of rows allocated to the second area A2 and the number of rows allocated to the third area A3 may be different.

The first electrode 30 of an OLED is positioned in the subpixels SP. The first electrode 30 may be allocated to each of the subpixels SP.

A bank 40 is positioned on the first electrode 30. The bank 40 includes a first bank 41 and a second bank 43.

The first bank 41 includes a first opening OA1 exposing at least some of the first electrode 30. A plurality of the first openings OA1 is arranged in parallel in the column direction, and is extended in the row direction. The first opening OA1 is extended in the row direction, and exposes a plurality of the first electrodes 30 arranged in the row direction.

The first bank 41 is positioned between the first electrodes 30 adjacent in the column direction, and may partition subpixels SP adjacent in the column direction. The first bank 41 may be positioned to cover one side of the first electrodes 30 between the first electrodes 30 adjacent in the column direction.

The first bank 41 is positioned in the first area A1. Furthermore, the first bank 41 may be selectively positioned in the second area A2 and/or the third area A3. For example, as will be described later, in the third aspect of the present disclosure, in order to improve the thickness uniformity of the organic emission layer 50 at an edge part, the first bank 41 may be selectively disposed only at a preset part in the second area A2, and may be selectively positioned only at a preset part in the third area A3. That is, at least one of the second area A2 and the third area A3 may include one area in which the first bank 41 is not positioned between first electrodes 30 adjacent in the column direction.

The second bank 43 is disposed on the substrate 10 in which the first bank 41 has been formed. The second bank 43 includes a second opening OA2 and third opening OA3 exposing at least some of the first electrode 30. Hereinafter, an example in which the third opening OA3 is formed in both the second area A2 and the third area A3 is described, for convenience of description, but the present disclosure is not limited thereto. That is, the third opening OA3 may be selectively formed in at least one of the second area A2 or the third area A3.

The second bank 43 includes a (2-1) bank 43-1 positioned between first electrodes 30 adjacent in the row direction and a (2-2) bank 43-3 positioned between first electrodes 30 adjacent in the column direction. The (2-1) bank 43-1 may be lengthily extended and disposed in the first area, the second area, and the third area. The (2-2) bank 43-2 is not positioned in the first area, but may be positioned in the second area and the third area.

In the first area A1, the second bank 43 may be positioned between first electrodes 30 adjacent in the row direction to partition subpixels SP adjacent in the row direction. The second bank 43 may be positioned to cover one side of the first electrodes 30 between the first electrodes 30 adjacent in the row direction.

The second openings OA2 are disposed in the first area A1. The second openings OA2 are extended in the column direction and arranged in parallel in the row direction. The second opening OA2 are extended in the column direction to expose a plurality of first electrodes 30 disposed in the column direction. That is, a plurality of first electrodes 30 arranged in column direction is allocated to one second opening OA2.

In the second area A2 and the third area A3, the second bank 43 may be positioned between first electrodes 30 adjacent in the row direction and positioned between first electrodes 30 adjacent in the column direction to partition subpixels SP adjacent in the row direction and the column direction. The second bank 43 may be positioned to cover one side of the first electrodes 30 between the first electrodes 30 adjacent in the row direction and the column direction.

One third opening OA3 may be allocated to one first electrode 30. The second bank 43 may be formed to cover the edge of the first electrode 30 in the second area A2 and the third area A3, thus exposing most of the central part of the first electrode 30.

The boundary of the third opening OA3 may be positioned inside the boundary of the first electrode 30. The boundary of the third opening OA3 determines a plane shape of the third opening OA1. The boundary of the first electrode 30 determines a plane shape of the first electrode 30. The boundary of the third opening OA3 may be spaced apart at a preset interval inside the boundary of the first electrode 30.

Accordingly, in the first area A1, part of the first electrode 30 exposed by a combination structure of the first bank 41 and the second bank 43 may be defined as an emission area. In the second area A2 and the third area A3, part of the first electrode 30 exposed by the second bank 41 may be defined as an emission area.

An organic emission layer 50 is positioned on the substrate 10 in which the second bank 43 has been formed. The organic emission layer 50 is formed over each of the second opening OA2 and the third opening OA3.

As shown in FIG. 12, the thickness of the bank 40 positioned between first electrodes 30 adjacent in the column direction is different in the first area A1 and the second and third areas A2 and A3. That is, the thickness of the bank 40 positioned between first electrodes 30 adjacent in the column direction in the second area A2 and the third area A3 may be set smaller than the thickness of the bank 40 positioned between first electrodes 30 adjacent in the column direction in the first area A1.

For example, in the first area A1, the bank 40 positioned between first electrodes 30 adjacent in the column direction has a first thickness t1 because it has a structure in which the first bank 41 and the second bank 43 have been stacked. In contrast, in the second area A2 and the third area A3, the bank 40 positioned between first electrodes 30 adjacent in the column direction has a second thickness t2 smaller than the first thickness t1 because it has only the second bank 43.

As described above, if the bank 40 having a small thickness is formed using only the second bank 43 in the second and third areas A2 and A3, it may be advantageous to secure the thickness uniformity of the organic emission layer at an edge part.

More specifically, FIG. 13 illustrates experiment data showing a comparison between the thickness profiles of the organic emission layer 50 in a first experiment example and second experiment example. In the first experiment example, the bank 40 confining the organic emission layer 50 has a stack structure of the first bank 41 and the second bank 43. The first experiment example may correspond to the structure of the bank 40 of the second area A2 and the third area A3 in the first aspect. In the first experiment example, the bank 40 has a thickness of 2.0 μm. In the second experiment example, the bank 40 confining the organic emission layer 50 has a single layer structure of the second bank 42. The second experiment example may correspond to the structure of the bank 40 of the second area A2 and the third area A3 in the second aspect. In the second experiment example, the bank has a thickness of 1.5 μm.

As shown in the experiment data, it may be seen that the structure of the second experiment example is advantageous in securing the thickness uniformity of the organic emission layer compared to the structure of the first experiment example.

The third aspect of the present disclosure can minimize a problem in that the organic emission layer 50 is formed in an irregular thickness at an edge part because the bank 40 is configured to have the single layer structure of the second bank 42 in the second and third areas A2 and A3.

Those skilled in the art may change and modify the present disclosure in various ways without departing from the technical spirit of the present disclosure through the above description. Accordingly, the technical range of the present disclosure should not be limited to the detailed contents of the specification, but should be determined by the claims.

What is claimed is:

1. An organic light-emitting display, comprising:
    a substrate having a first area and second and third areas neighboring the first area in a column direction and defined in edge parts of both sides in the first area;
    a plurality of subpixels arranged on the substrate in the column direction and a row direction crossing the column direction;
    a plurality of first electrodes allocated to each of the plurality of subpixels; and
    a bank positioned on the first electrodes,
    wherein the bank comprises:
    a first bank having a first opening exposing the plurality of first electrodes arranged in the row direction; and
    a second bank having a second opening exposing the plurality of first electrodes arranged in the column direction in the first area and a third opening exposing the one first electrode in at least one of the second area and the third area.

2. The organic light-emitting display of claim 1, wherein the first bank is positioned between two adjacent first electrodes in the column direction.

3. The organic light-emitting display of claim 2, wherein the first bank is positioned between two adjacent first electrodes in the column direction in the first area, positioned between two adjacent first electrodes in the column direction in a preset area of the second area, and positioned between two adjacent first electrodes in the column direction in a preset area of the third area.

4. The organic light-emitting display of claim 2, wherein at least one of the second area and the third area comprises one area in which the first bank is not positioned between two adjacent first electrodes in the column direction.

5. The organic light-emitting display of claim 1, wherein the second bank is positioned between two adjacent first electrodes in the row direction.

6. The organic light-emitting display of claim 1, wherein the second bank comprises a first sub-bank positioned between two adjacent first electrodes in the row direction and a seconds sub-bank positioned between two adjacent first electrodes in the column direction, wherein the first sub-bank bank is extended and positioned in the first area, the second area and the third area, and the seconds sub-bank bank is positioned in at least one of the second area and the third area.

7. The organic light-emitting display of claim 1, wherein a thickness of the bank positioned between two adjacent first electrodes in the column direction in one of the second area and the third area is smaller than a thickness of the bank positioned between two adjacent first electrodes in the column direction in the first area.

8. The organic light-emitting display of claim 7, wherein the bank positioned between the two adjacent first electrodes in the column direction in one of the second area and the third area has a single structure comprising only the second bank.

9. The organic light-emitting display of claim 7, wherein the bank positioned between the two adjacent first electrodes in the column direction in the first area has a stack structure of the first bank and the second bank.

10. The organic light-emitting display of claim 1, further comprising an organic emission layer positioned over the second opening and the third opening,
wherein the organic emission layers emitting an identical color are disposed in the second opening and third opening neighboring in the column direction.

11. The organic light-emitting display of claim 1, wherein the first bank has a hydrophilic property, and the second bank has a hydrophobic property.

12. An organic light-emitting display, comprising:
a substrate where first, second and third areas are defined, and the first area being adjacent to both of the second and third areas in a row direction;
a plurality of subpixels arranged on the substrate in the row direction;
a plurality of first electrodes disposed in each of the plurality of subpixels;
a first bank disposed between two adjacent first electrodes in the column direction and having a first opening exposing the plurality of first electrodes arranged in a column direction that crosses the row direction; and
a second bank disposed between two adjacent first electrodes in the row direction and having a second opening exposing the plurality of first electrodes arranged in the column direction in the first area and a third opening exposing the one first electrode in at least one of the second area and the third area.

13. The organic light-emitting display of claim 12, wherein the first bank is positioned between the two adjacent first electrodes in the column direction in the first area, a preset area of the second area and a preset area of the third area.

14. The organic light-emitting display of claim 12, wherein at least one of the second area and the third area comprises one area in which the first bank is not positioned between the two adjacent first electrodes in the column direction.

15. The organic light-emitting display of claim 12, wherein the second bank comprises a first sub-bank positioned between the two adjacent first electrodes in the row direction and a seconds sub-bank positioned between the two adjacent first electrodes in the column direction.

16. The organic light-emitting display of claim 15, wherein the first sub-bank bank is disposed in the first area, the second area and the third area, and the second sub-bank is positioned in at least one of the second area and the third area.

17. The organic light-emitting display of claim 12, wherein a thickness of the bank positioned between the two adjacent first electrodes in the column direction in one of the second area and the third area is smaller than a thickness of the bank positioned between the two adjacent first electrodes in the column direction in the first area.

18. The organic light-emitting display of claim 17, wherein the bank positioned between the two adjacent first electrodes in the column direction in one of the second area and the third area has a single structure comprising only the second bank.

19. The organic light-emitting display of claim 17, wherein the bank positioned between the two adjacent first electrodes in the column direction in the first area has a stack structure of the first bank and the second bank.

20. The organic light-emitting display of claim 12, further comprising an organic emission layer positioned over the second opening and the third opening,
wherein the organic emission layers emitting an identical color are disposed in the second opening and third opening neighboring in the column direction.

* * * * *